(12) United States Patent
Fujiwara

(10) Patent No.: US 7,084,712 B2
(45) Date of Patent: Aug. 1, 2006

(54) CLOCK GENERATION SYSTEM

(75) Inventor: Masayu Fujiwara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 30 days.

(21) Appl. No.: 10/919,634

(22) Filed: Aug. 17, 2004

(65) Prior Publication Data

US 2005/0057311 A1    Mar. 17, 2005

(30) Foreign Application Priority Data

Sep. 12, 2003    (JP) .............................. 2003-320674

(51) Int. Cl.
*H03B 19/12* (2006.01)
*H03K 3/03* (2006.01)
*H03K 21/00* (2006.01)
*H03K 23/00* (2006.01)
*H03L 7/00* (2006.01)

(52) U.S. Cl. .............................. 331/51; 331/2; 331/46; 377/48

(58) Field of Classification Search ............... 331/2, 331/46, 50, 51; 377/48
See application file for complete search history.

(56) References Cited

U.S. PATENT DOCUMENTS

| | | | |
|---|---|---|---|
| 5,391,996 A * | 2/1995 | Marz | 327/158 |
| 6,608,530 B1 * | 8/2003 | Green et al. | 331/25 |
| 6,614,319 B1 * | 9/2003 | Saeki et al. | 331/17 |
| 6,668,035 B1 * | 12/2003 | Han et al. | 377/48 |
| 6,765,977 B1 * | 7/2004 | Adams et al. | 375/376 |
| 6,822,491 B1 * | 11/2004 | Glass | 327/115 |
| 6,828,863 B1 * | 12/2004 | Itkin et al. | 331/2 |
| 2001/0008384 A1 * | 7/2001 | Ku | 331/2 |
| 2004/0232995 A1 * | 11/2004 | Thomsen et al. | 331/2 |

* cited by examiner

*Primary Examiner*—Robert Pascal
*Assistant Examiner*—James Goodley
(74) *Attorney, Agent, or Firm*—Hogan & Hartson LLP

(57) ABSTRACT

A frequency-divided reference frequency clock is provided as a reference input to a phase comparator. An oscillation frequency signal of a controllable oscillator, having a frequency associated with another reference frequency clock, is frequency divided by a frequency division factor switching type comparison-input frequency division circuit. The resultant frequency-divided clock is provided as a comparison input to the phase comparator. The frequency division factor of the comparison-input frequency division circuit is switched from one to another based on a frequency division factor control signal to generate an oscillation frequency signal having a predetermined frequency ratio relative to another reference frequency clock. Thus, three reference frequency clocks of 27 MHz, 33.8688 MHz, and 36.864 MHz in accord with the MPEG format are obtained with a sufficient S/N ratio.

9 Claims, 5 Drawing Sheets

FIG. 4

| | | 27 MHz STANDARD | |
| --- | --- | --- | --- |
| | | RELATED ART (FIG. 5) | THIS INVENTION (FIG. 3) |
| 27MHz | FOR VIDEO | 80dB | 80dB |
| 13.5MHz | FOR VIDEO | 86dB | 86dB |
| | | | |
| 36.864MHz | 48K:768fs 32K:1152fs | 36.0dB | 59.4dB |
| 24.576MHz | 48K:512fs 32K:768fs | 39.5dB | 63.0dB |
| 18.432MHz | 48K:384fs 32K:576fs | 42.0dB | 65.4dB |
| 12.288MHz | 48K:256fs 32K:384fs | 45.5dB | 69.0dB |
| | | | |
| 33.8688MHz | 44.1K:768fs | 32.3dB | 60.2dB |
| 22.5792MHz | 44.1K:512fs | 35.8dB | 63.7dB |
| 16.934MHz | 44.1K:384fs | 38.3dB | 66.2dB |
| 11.2896MHz | 44.1K:256fs | 41.8dB | 69.7dB |
| | | | |

CLOCK GENERATION SYSTEM

FIELD OF THE INVENTION

This invention relates to a clock generation system for generating a first through third reference frequency clocks having predetermined frequency ratios relative to a given frequency clock. More particularly, the invention relates to a clock generation system for generating a multiplicity of reference frequency clocks necessary for DVD (Digital Versatile Disc) systems or DVC (Digital Video Cassette recorder) systems.

BACKGROUND OF THE INVENTION

As is well known, existing DVD systems such as a DVD player, DVD-R and DVD-RW drives, and MPEG (Moving Picture Experts Group) format systems require multiple reference frequency clocks. These reference frequency clocks include at least a first series of reference frequency clocks for video use based on a 27 MHz clock (the series referred to as 27 MHz first clock series), a second series of reference frequency clocks for audio use based on a 33.8688 MHz clock (particularly for CDs, having frequencies that are integral multiples of 44.1 kHz sampling frequency, referred to as 33.8688 MHz second reference frequency clock series), and a third series of reference frequency clocks for audio use based on a 36.864 MHz clock (particularly for DVDs, having frequencies that are integral multiples of 48 kHz and 32 kHz sampling frequencies, referred to as third 36.864 MHz third reference frequency clock series).

Each of these three reference frequency clock series can be obtained using a respective oscillation module. In this approach, however, one oscillation module must be provided for each reference frequency, which results in an increase of cost of the clock generation system.

Conventionally, in order to reduce the cost, use is made of a well-known PLL (Phase Locked Loop) circuit to generate two of the three reference frequency clock series from one reference frequency clock.

Referring to FIG. 5, there is shown a clock generation system in accordance with related art. This clock generation system utilizes one of the three reference frequency clocks to generate the rest of the reference frequency clock series by means of two PLL circuits. The clock generation system shown in FIG. 5 was devised by the present inventor in the process of developing the inventive system, and has not been disclosed to the public. Therefore, the clock generation system shown in FIG. 5 is not prior art.

The clock generation system of FIG. 5 generates a second series Fr2s of reference frequency clocks (33.8688 MHz series) and a third series Fr3s of reference frequency clocks (36.864 MHz series) from a first reference frequency clock Fr1 (27 MHz) generated by an oscillation module.

A first PLL circuit 50a of FIG. 5 has a first frequency divider 51a for frequency-dividing the 27 MHz first reference frequency clock Fr1 inputted thereto by a frequency division factor of 625. The divided clock is supplied to a phase comparator (PD) 53a as a comparison input P1 thereto. A second frequency divider 52a frequency-divides the output of the PLL circuit 50a by 3136, and supplies the resultant clock to the phase comparator 53a as another comparison input P2 thereto. The phase comparator 53a compares the phases of the two comparison inputs P1 and P2, to generate a comparison output in accord with the phase difference between them. The comparison output is smoothed by a low-pass filter (LPF) 54a before it is supplied as a control input to a controllable oscillator (e.g. voltage controlled oscillator: VCO) 55a. The frequency of the voltage controlled oscillator 55a is controlled by the control input so as to cause the two inputs of the phase comparator 53a to have the same frequency and to be in phase. The loop gain of the PLL circuit is so large that the control deviation that remains is very small. Thus, the frequency of the output of the voltage controlled oscillator 55a is converted to 135.4752(=27×3136/625) MHz in accord with the frequency division factors of the frequency dividers 51a and 52a.

The output of the voltage controlled oscillator 55a is frequency-divided by a frequency divider 56a by a factor of 4 to generate a second reference frequency clock Fr2. The output of the voltage controlled oscillator 55a is further frequency-divided by a ⅙-frequency divider 57a, ⅛-frequency divider 58a, and 1/12-frequency divider 59a to generate 22.5792 MHz, 16.9344 MHz, and 11.2896 MHz clocks, respectively. These frequencies have specific frequency ratios relative to the second reference frequency clock Fr2. Together with the second reference frequency clock Fr2, these clocks constitute the second series Fr2s of reference frequency clocks for use in CD sampling, all having integral multiples of 44.1 kHz CD sampling frequency.

A second PLL circuit 50b also performs similar frequency division to that of the first PLL circuit 50a, except that the frequency division ratio of the first frequency divider 51b is 1/375, while that of the second frequency divider 52b is 1/2048. The frequency of the output of the voltage controlled oscillator 55b is converted to 147.456 (=27×2048/375) MHz in accord with the frequency division ratios of the frequency dividers 51b and 52b. Incidentally, reference numeral 53b indicates a phase comparator, and 54b a low-pass filter.

The output of the voltage controlled oscillator 55b is frequency-divided by a frequency divider 56b by a factor of 4 to produce a third reference frequency clock Fr3. In addition, the output of the voltage controlled oscillator 55b is further frequency-divided by a ⅙-frequency divider 57b, a ⅛-frequency divider 58b, and a 1/12-frequency divider 59b to generate further clocks having frequencies of 24.576 MHz, 18.432 MHz, and 12.288 MHz, respectively, which have specific frequency ratios relative to the third reference frequency clock Fr3. These reference frequency clocks constitute the third reference frequency clock series Fr3s. Each of the third reference frequency clock series Fr3s has a frequency that is an integral multiple of DVD audio sampling frequencies, 48 kHz and 32 kHz.

The first reference frequency clock series Fr1s includes the first reference frequency clock Fr1 and a 13.5 MHz clock obtained by frequency-dividing the first reference frequency clock Fr1 by a ½-frequency divider 56c.

Thus, one may choose necessary frequency clocks from the first through third reference frequency clock series Fr1s-Fr3s for his use.

The S/N (signal-to-noise) ratios of the clocks generated by the clock generation system shown in FIG. 5 can be obtained using a known S/N theory as follows. As an example, the S/N ratios of the clocks belonging to the second reference frequency clock series Fr2s will be discussed. When the first reference frequency clock Fr1 is frequency-divided by 625, the S/N ratio of the frequency-divided clock is improved by 20log625 [dB]. Hence, theoretically, the S/N ratio [dB] of the output signal of the first frequency divider 51a will be equal to (S/N ratio [dB] of the first reference frequency clock+20log625) [dB]. Assuming that the S/N ratio of the first reference frequency clock is 80 [dB], the S/N ratio of the output signal will be 80+56=136

[dB]. Note that the S/N ratios are rounded off (the same is true in the discussion below).

It should be noted, however, that since the PLL circuit is in operation on the noise floor of an IC (integrated circuit) on which the PLL circuit is formed, the S/N ratio of the PLL circuit is limited by the S/N ratio of the noise floor. The S/N ratio of the noise floor is governed by the fluctuations of the power supply potential, which is on the order of 90 [dB]. Hence, the S/N ratio of the PLL circuit is limited by the S/N ratio (90 [dB]) of the noise floor. Hence, the S/N ratio [dB] of the output of the first frequency divider 51a, that is one comparison input P1 to the PD 53a, is at best 90 [dB].

Since the S/N ratios [dB] of the comparison inputs P1 and P2 to the phase comparator 53a are the same, the S/N ratio of the comparison input P2 is 90 [dB]. The S/N ratio of the comparison input to the second frequency divider 52a is lowered by 20log3136 [dB], since the comparison input P2 is multiplied accordingly by 3136. Thus, the S/N ratio [dB] of the input to the second frequency divider 52a becomes 90 [dB] of the comparison input P2 minus 20log3136 [dB], or 20.3 [dB].

Thus, the S/N ratios of the clocks belonging to the second reference frequency clock series Fr2s are 32.3 [dB] for the second reference frequency clock Fr2, 35.8 [dB] for the 22.5792 MHz clock, 38.3 [dB] for the 16.9344 MHz clock, and 41.8 [dB] for the 11.2896 MHz clock.

Similar calculations give the S/N ratios of the clocks of the third reference frequency clock series Fr3s to be 36.0 [dB] for the third reference frequency clock Fr3; 39.5 [dB] for the 24.576 MHz clock; 42.0 [dB] for the 18.432 MHz clock; and 45.5 [dB] for the 12.288 MHz clock.

In this way, using PLL circuits and frequency dividers as shown in FIG. 5, it is possible to generate second reference frequency clock series Fr2s that includes the second reference frequency clock Fr2 having a predetermined frequency, and a third reference frequency clock series Fr3s that includes the third reference frequency clock Fr3 having another predetermined frequency, all of the clocks belonging to the second and third series Fr2s and Fr3s respectively having predetermined frequency ratios relative to the first reference frequency clock Fr1. However, the S/N ratios of the clocks belonging to the second and third reference frequency clock series are lowered to between 30 [dB] and 40 [dB]. Since clocks for use in DVD systems in general require an S/N ratio of at least 50 [dB], preferably more than 60 [dB]. Therefore, deterioration in S/N ratio is a problem that must be solved.

SUMMARY OF THE INVENTION

It is, therefore, an object of the invention to provide a clock generation system for generating multiple reference frequency clock series, in accord with the MPEG format, using PLL circuits adapted to provide multiple frequency clock series that includes a first reference frequency clock series (27 MHz series) for DVD systems, a second reference frequency clock series (33.8588 MHz series) for audio systems (particularly for CDs), and a third reference frequency clock series (36.864 MHz series) for audio systems (particularly for DVDs), with a reduced number of oscillation modules and with sufficient S/N ratios in spite of the limitation by the S/N ratio of the noise floor involved.

In accordance with one aspect of the invention, there is provided a clock generation system for generating at least a first frequency clock (Fr1), a second frequency clock (Fr2) having a predetermined first frequency ratio relative to the first frequency clock (Fr1), and a third frequency clock (Fr3) having a predetermined second frequency ratio relative to the first frequency clock, the clock generation system comprising:

a first PLL circuit (10a) that includes a frequency division factor switching type frequency division circuit having
  a first phase comparator (13a) for comparing the phases of a first reference input clock (P1) and a first comparison input clock (P2) to generate a first phase comparison output in accordance with the comparison,
  a first low-pass filter (14a) for passing the first phase comparison output,
  a first controllable oscillator (15a) receiving the filtered output from the first low-pass filter (14a) as a control input for controlling the first controllable oscillator (15a) adapted to generate a first oscillation frequency signal having a predetermined frequency ratio relative to the second frequency clock (Fr2),
  a first reference input frequency division circuit (11a) for frequency-dividing the first frequency clock (Fr1) that is inputted as a reference clock to thereby obtain the first reference input clock (P1), and
  a first comparison input frequency division circuit (12a) for frequency-dividing the first oscillation frequency signal of the first controllable oscillator (15a) to obtain the first comparison input clock (P2), wherein one of the first comparison input frequency division circuit (12a) and first reference input frequency division circuit (11a) is adapted to frequency-divide the first oscillation frequency signal or the first frequency clock, respectively, by a different frequency division factor according to a first frequency division factor control signal;

a first frequency division factor control circuit (20a) receiving a clock based on the first oscillation frequency signal and one of the first comparison input clock (P2) and first reference input clock (P1), generating the first frequency division factor control signal such that the first oscillation frequency signal has a fixed frequency ratio relative to the second frequency clock (Fr2), and switching the frequency division factor of the first comparison input frequency division circuit (12a) or of the first reference input frequency division circuit (11a);

a second PLL circuit (10b) that includes a frequency division factor switching type frequency division circuit having
  a second phase comparator (13b) for comparing the phases of a second reference input clock (P1) and a second comparison input clock (P2) to generate a second phase comparison output in accord with the comparison,
  a second low-pass filter (14b) for passing the second phase comparison output,
  a second controllable oscillator (15b) receiving the filtered output from the second low-pass filter (14b) as a control input for controlling the second controllable oscillator (15b) adapted to generate a second oscillation frequency signal having a predetermined frequency ratio relative to the third frequency clock (Fr3),
  a second reference input frequency division circuit (11b) for frequency-dividing the first frequency clock (Fr1) that is inputted as a reference clock to thereby obtain the second reference input clock (P1), and
  a second comparison input frequency division circuit (12b) for frequency-dividing the second oscillation frequency signal of the second controllable oscillator (15b) to obtain the second comparison input clock, wherein one of the second comparison input frequency division circuit (12b) and second reference input frequency division circuit (11b) is adapted to frequency-divide the second oscillation frequency signal or the first frequency clock, respectively, by a different frequency division factor according to a second frequency division factor control signal; and a second frequency division factor control circuit (10b) receiving a clock based on the second oscillation frequency signal and one of the second comparison input clock (P2) and the second reference input clock (P1), generating the second frequency division factor control signal such that the second oscillation frequency signal has a fixed frequency ratio relative to the third frequency clock (Fr3), and switching the frequency division factor of the second comparison input frequency division circuit (12b) or of the second reference input frequency division circuit (11b).

In the inventive clock generation system, the second frequency clock may be obtained by frequency-dividing the first oscillation frequency signal by a predetermined frequency division factor, while the third frequency clock may be obtained by frequency-dividing the second oscillation frequency signal by a predetermined frequency division factor. The frequencies of the first, second, and third frequency clocks may be 27 MHz, 33.8688 MHz, and 36.864 MHz, respectively.

The inventive clock generation system may further comprise:

a first group of multiple frequency dividers for frequency-dividing the first oscillation frequency signal by different frequency division factors to generate a second frequency clock series that includes the second frequency clock and a multiplicity of clocks each having a predetermined frequency ratio relative to the second frequency clock;

a second group of multiple frequency dividers for frequency-dividing the second oscillation frequency signal by different frequency division factors to generate a third frequency clock series that includes the third frequency clock and a multiplicity of clocks each having a predetermined frequency ratio relative to the third frequency clock; and at least one frequency divider for frequency-dividing the first frequency clock by a predetermined frequency division factor to generate a first frequency clock series that includes the first frequency clock and at least one clock having a predetermined frequency ratio relative to the first frequency clock.

The first frequency division factor control circuit may have a first flip-flop circuit receiving as a clock input a clock based on the first oscillation frequency signal and receiving as a data input one of the first comparison input clock and first reference input clock, a first counter for repetitively counting the output of the first flip-flop circuit from the initial to a preset value, a first decoder for generating a first decode output obtained by decoding the count of the first counter, and a second flip-flop circuit receiving as a data input the first decode output and receiving as a clock input the output of the first flip-flop circuit to output the first frequency division factor control signal.

The second frequency division factor control circuit may have a third flip-flop circuit receiving as a clock input a clock based on the second oscillation frequency signal and receiving as a data input one of the second comparison input clock and second reference input clock, a second counter for repetitively counting the output of the third flip-flop circuit from the initial thereof to a preset value, a second decoder for generating a second decode output obtained by decoding the count of the second counter, and a fourth flip-flop circuit receiving as a data input the second decode output and receiving as a clock input the output of the third flip-flop circuit to output the second frequency division factor control signal.

In view of the fact that the S/N ratio of a PLL circuit is increased in accord with the frequency division and decreased in accord with multiplication of the frequency and that it is limited by the S/N ratio of the noise floor, the inventive clock generation system dynamically switches a comparison input frequency division factor from one factor to another in accordance with a frequency control signal. Because of the frequency division factor being switchable, apparent frequency division factor can be reduced to improve the S/N ratio.

Three series of reference frequency clocks in accord with the MPEG format, which includes a first 27 MHz reference frequency clock series, a second 33.8588 MHz reference frequency clock series for audio use (particularly clocks of integral multiples of 44.1 kHz sampling frequency for CDs), and a third 36.864 MHz reference frequency clock series for audio use (particularly clocks of integral multiples of 48 kHz sampling frequency and 32 kHz sampling frequency for DVDs), can be generated with sufficient S/N ratios, in spite of the limitation by the S/N ratio of the noise floor, by the use of the inventive PLL circuits with a reduced number of oscillation modules.

A clock generation system that operates on the basis of the first 27 MHz reference clock is advantageous in that high-quality 27 MHz crystal oscillators are available at low cost.

BRIEF DESCRIPTION OF THE DRAWINGS

FIG. 4 is a table showing the clocks of the respective frequency clock series and the S/N ratios associate therewith.

DETAILED DESCRIPTION OF THE PREFERRED EMBODIMENT

The inventive clock generation system will now be described in detail by way of example with reference to the accompanying drawings.

Figure 1:
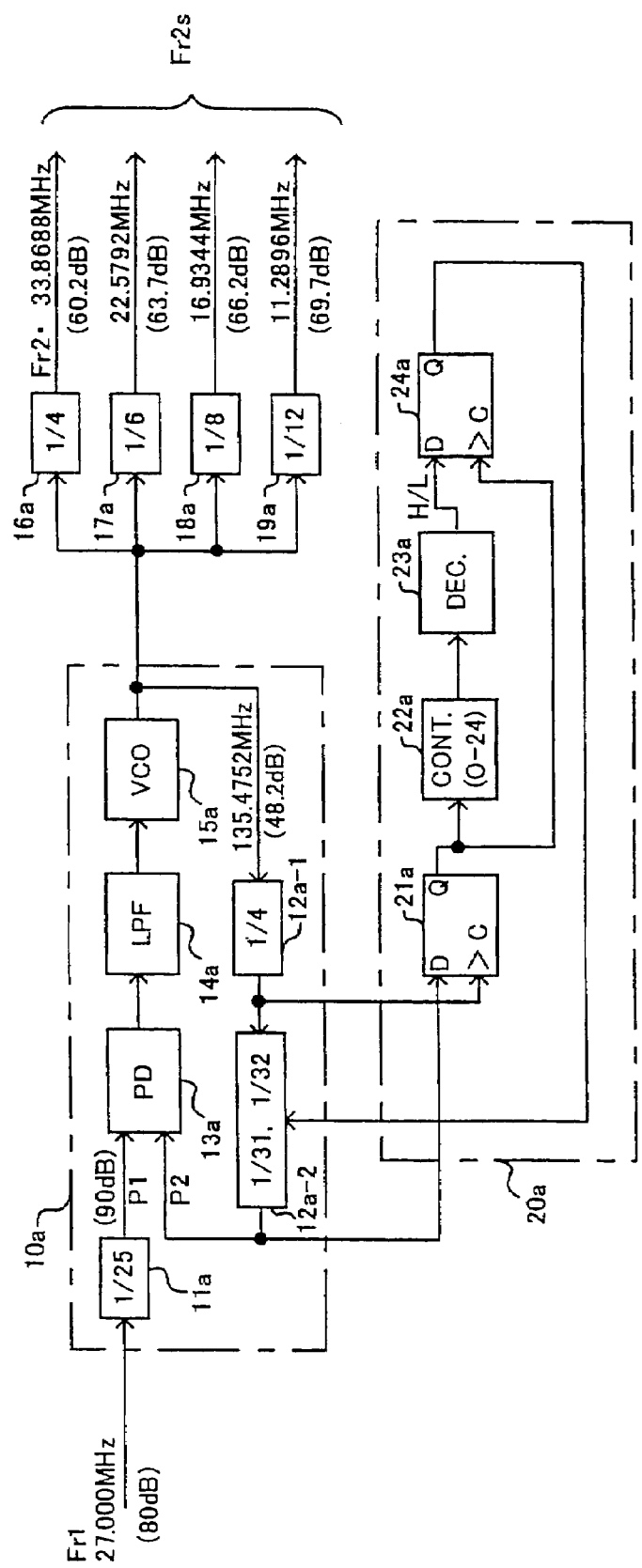
FIG. 1 is a block diagram representation of a clock generation system in accordance with a first embodiment of the invention.

Referring to FIG. 1, there is shown a clock generation system utilizing PLL circuits in accordance with a first embodiment of the invention. The clock generation system of FIG. 1 is designed to generate a second 33.8688 MHz series of reference frequency clocks for audio use (particularly for CDs) upon receipt of a first 27 MHz reference frequency clock for video use as a reference clock.

The S/N ratio of a PLL circuit improves in accord with frequency division factor and falls in accord with multiplication factor of the PLL circuit. It is limited by the S/N ratio of the noise floor. The frequency division ratio necessary to obtain the 33.8688 MHz second reference frequency clock from the first 27 MHz reference frequency clock using the PLL circuit is 3136/625, as discussed previously in connection with FIG. 5. Since there is no common divisor for 3136 and 625, the S/N ratio of the oscillation frequency signal has been low.

In the present invention, one of the frequency division factors of the two frequency division circuits of the PLL circuit (that is, a reference input frequency division circuit and a comparison input frequency division circuit) is dynamically switched from one to another according to the frequency division factor control signal. Such switching reduces the apparent frequency division factor of the PLL circuit, improving the S/N ratio. In what follows the invention will be described for a case where the frequency division factor of the comparison input frequency division circuit is switched. However, it should be understood that alternatively the frequency division factor of the reference input frequency division circuit may be switched.

The clock generation system of FIG. 1 generates a first frequency clock Fr1 as a reference clock and a second frequency clock Fr2 having a first predetermined frequency ratio to the first frequency clock Fr1. In the example shown herein, the frequencies of the first frequency clock Fr1 and the second frequency clock Fr2 are 27 MHz and 33.8688 MHz, respectively.

As shown in FIG. 1, the first frequency clock Fr1 is inputted into a first PLL circuit 10*a* as a reference clock to generate a first oscillation frequency signal of 135.4752 MHz. The first oscillation frequency signal is frequency-divided by a frequency divider 16*a* by a frequency division factor of 4 to generate a second frequency clock Fr2.

The first frequency clock Fr1 inputted into the PLL circuit 10*a* is frequency-divided by a first reference input frequency division circuit 11*a* by 25. Same as conventional, if the S/N ratio of the first frequency clock Fr1 is 80 [dB], the S/N ratio of the first reference input clock P1 turns out, theoretically, to be 80 [dB]+20log25 [dB]=108 [dB]. However, the S/N ratio of the first reference input clock P1 is limited to at most 90 [dB] by the S/N ratio of the noise floor.

The first reference input clock P1 and a first comparison input clock P2 are inputted to a first phase comparator 13*a*, which compares the phases of these two inputs P1 and P2, and outputs a first phase comparison output in accord with the comparison. The first phase comparator 13*a* has a phase-frequency comparison unit for comparing the phases and frequencies of the first reference input clock P1 and the first comparison input clock P2, providing an "up" signal or a "down" signal in accord with the comparison, and a charge pump circuit for charging up or discharging a capacitor in response to the "up" or "down" signal.

A first low-pass filter 14*a* passes the first phase comparison output received from the first phase comparator 13*a*. Specifically, it can be formed of a capacitor and a resistor.

A first controllable oscillator 15*a* receives the filtered output from the first low-pass filter 14*a* as a control input and generates the first oscillation frequency signal having a fixed frequency ratio relative to the second frequency clock Fr2. The first controllable oscillator 15*a* is preferably a voltage controlled oscillator (VCO) whose oscillation frequency is controlled by the voltage of the control input.

A first comparison input frequency division circuit 12*a* is a frequency division factor switching type frequency division circuit for obtaining the first comparison input clock P2 through dynamic frequency division of the first oscillation frequency signal received from the first controllable oscillator 15*a* in accordance with the frequency control signal supplied by a first frequency division factor control circuit 20*a*, in which the first oscillation frequency signal is frequency divided by different frequency division factors.

The first comparison input frequency division circuit 12*a* has a frequency division circuit 12*a*-1 having a fixed frequency division factor and a frequency division circuit 12*a*-2 connected in series with the first frequency division circuit 12*a*-1 and having a variable frequency division factor, which can be varied through switching according in accordance with the first frequency control signal. The frequency division factor of the frequency division circuit 12*a*-1 is 4, and the frequency division factors of the frequency division circuit 12*a*-2 are 31 and 32. Alternatively, the first comparison input frequency division circuit 12*a* may be replaced by a frequency division circuit having a variable frequency division factor. In this case, the variable frequency division factor of the frequency division circuit may take on 124 and 128.

In order that the first 135.4752 MHz oscillation frequency signal can be obtained from the first 27 MHz frequency clock Fr1, the switching of the frequency division factor of the frequency division circuit 12*a*-2 is performed such that the frequency division factor "32" is selected 9 times when the frequency division factor "31" is selected 16 times. The resultant frequency division ratio is 3136/625, which is the same as conventional, as given by the following formula.

$$3136/625=[(4\times31\times16)/25+(4\times32\times9)/25]\times1/25=125.44/25\ 27\ MHz\times125.44/25=135.4752\ MHz$$

The S/N ratios [dB] of the first reference input clock P1 of the first phase comparator 13*a* and of the first comparison input clock P2 are then 90 [dB]. Since the input to the first comparison input frequency division circuit 12*a* is the first comparison input clock P2 multiplied by 125.44, the S/N ratio will be reduced by the multiplication by 20log125.44 [dB]. Hence, the S/N ratio of the input to the first comparison input frequency division circuit 12*a*, i.e. the S/N ratio [dB] of the first oscillation frequency signal, amounts to 90 [dB] of the first comparison input clock P2 minus 20log125.44 [dB], which is equal to 48.2 [dB]. This S/N ratio, 48.2 [dB], is much higher as compared with that of related art.

The first frequency division control signal is formed by the first frequency division factor control circuit 20*a*. The first frequency division factor control circuit 20*a* has a first FF circuit 21*a* which receives as a clock input thereto the output clock (having a ¼ frequency of the first oscillation frequency signal) of the frequency division circuit 12*a*-1 and also receives as a data input the output clock of frequency division circuit 12*a*-2 (that is, the first comparison input clock P2), and generates an output signal Q. The first FF circuit 21*a* is preferably a D type FF circuit. Other FF circuits of the invention have the same structure as described above.

A first counter 22*a* is a repetition type counter adapted to repeat counting, starting from an initial value, 0 for example, to a preset value, 24 for example, upon receipt of the output signal Q from the first FF circuit 21*a*, and then outputs the count.

A first decoder 23*a* generates a first decode output obtained by decoding the count of the first counter 22*a*. The first decode output consists of 16 high (H) level outputs and 9 low (L) level outputs in accord with the count 0–24. Preferably, the count is decoded such that the H and L levels are randomly distributed as much as possible in sequence, like, for example, H, H, L, H, H, L, H, H, L, H, H, L, H, H, L, H, H, L, H, H, L, H, H, L, and L.

A second FF circuit 24a receives as a data input the first decode output (H/L) of the first decoder 23a, and as a clock input the output of the first FF circuit 21a, and provides its Q output as the first frequency division factor control signal having H or L level. This first frequency division factor control signal is supplied to the frequency division circuit 12a-2. When the first frequency division factor control signal is high (H), frequency division factor "31" is selected. When it is low (L), frequency division factor "32" is selected.

Every time the frequency division factor is selected (or switched), the output of the first phase comparator 13a changes slightly. However, the change has no appreciable influence on the oscillation frequency of the first controllable oscillator 15a, since any slight change in phase of the phase comparison output is absorbed by the first low-pass filter 14a.

A first group of multiple frequency dividers 16a, 17a, 18a, and 19a are provided to perform frequency division of the 135.4752 MHz first oscillation frequency signal by four frequency division factors 4, 6, 8, and 12. The first group of multiple frequency dividers 16a, 17a, 18a, and 19a provides a second series of clocks Fr2s that includes the second frequency clock Fr2 (with S/N ratio of 60.2 [dB]) and clocks of 22.5792 MHz (with S/N ratio of 63.7 [dB]), 16.9344 MHz (with S/N ratio of 66.2 [dB]), and 11.2896 MHz (with S/N ratio of 69.7 [dB]) each having a predetermined frequency ratio relative to the second frequency clock Fr2.

It should be appreciated that, from the 27 MHz reference frequency clock, the second 33.8688 MHz reference frequency clock series can be generated with sufficient S/N ratios using one PLL circuit, in spite of the limitation by the S/N ratio of the noise floor.

A clock generation system that operates on the basis of the first 27 MHz reference clock is advantageous in that high-quality 27 MHz crystal oscillators are available at low cost.

Figure 2:
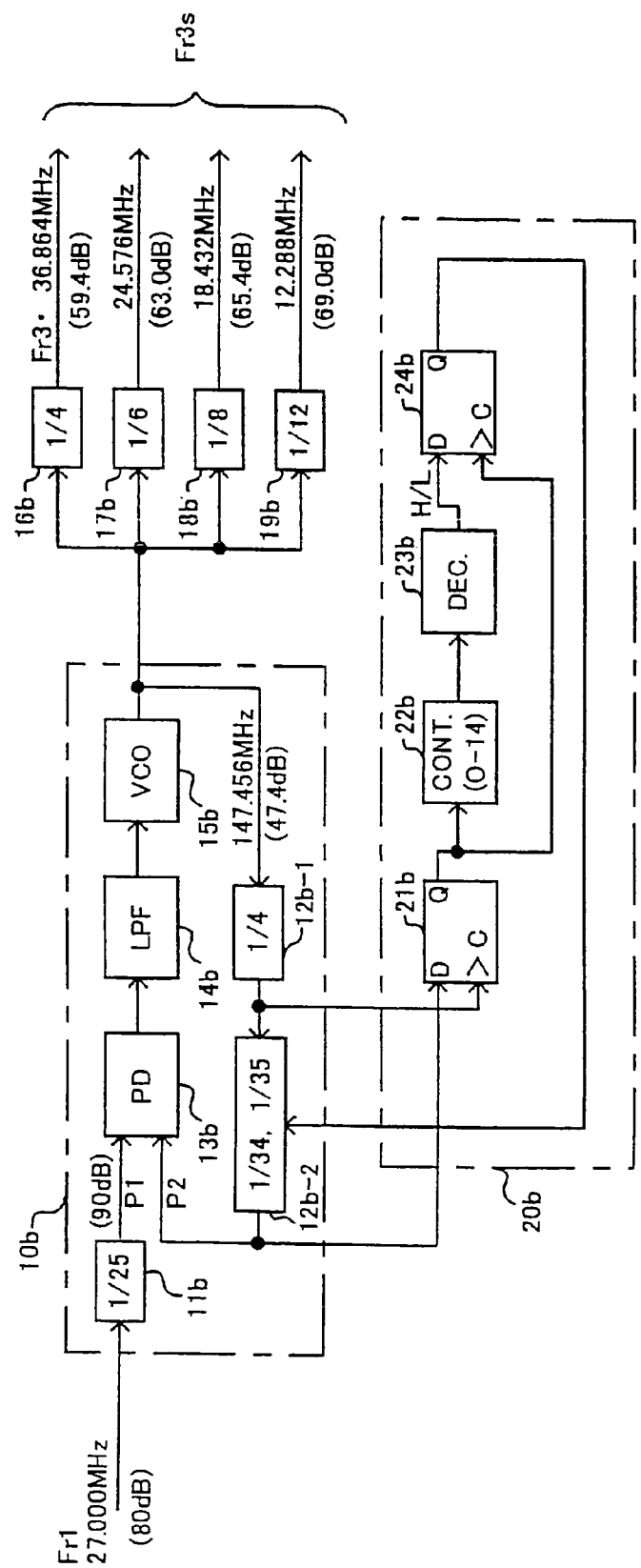
FIG. 2 is a block diagram representation of a clock generation system in accordance with a second embodiment of the invention.

Referring to FIG. 2, there is shown a clock generation system utilizing PLL circuits in accordance with a second embodiment of the invention. The clock generation system shown in FIG. 2 receives as a reference clock the 27 MHz first reference frequency clock for video use, and generates a 36.864 MHz third reference frequency clock series for audio use (particularly for DVDs). Since the clock generation system in accordance with the second embodiment is basically the same in structure as the first embodiment shown in FIG. 1, the second embodiment will be mainly described in detail with respect to the points thereof that differ from the first one.

Thus, the frequency division ratio necessary for getting the third reference frequency of 36.864 MHz from the first reference frequency clock 27 MHz using PLL circuit is 2048/375, as discussed in connection with FIG. 5. Since there is no common divisor for the numerator and denominator of the frequency division ratio, 2048/375, the S/N ratio of an oscillation frequency signal has been low. In the example shown herein also, the frequency division factor of one of the two PLL circuits, that is, the reference input frequency division circuit and comparison input frequency division circuit, is dynamically switched from one to another in accordance with the frequency control signal. Switching the frequency division factor in this way, apparent frequency division factor can be reduced to improve the S/N ratio.

Figure 5:
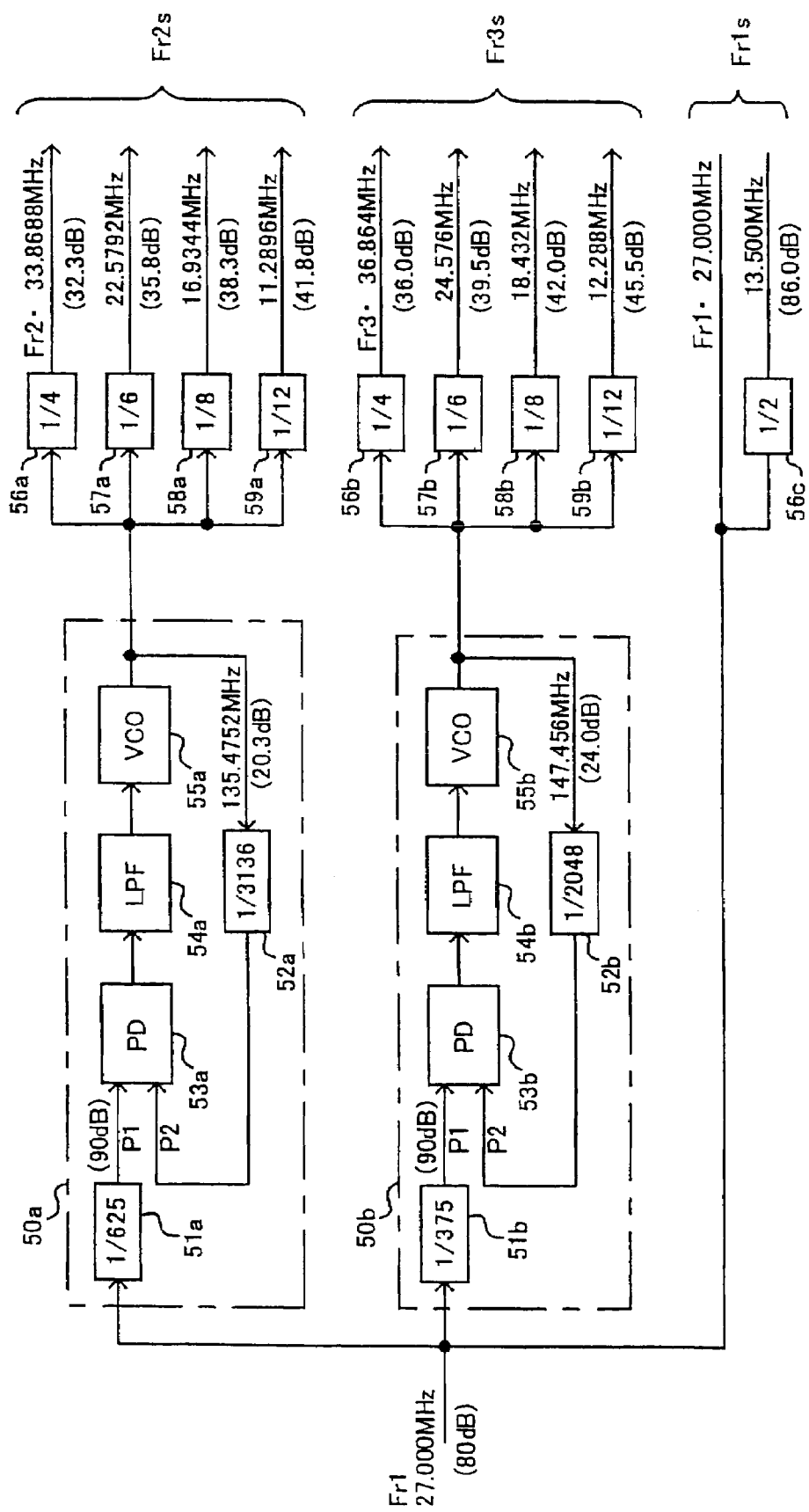
FIG. 5 is a block diagram representation of a clock generation system in related art.

The clock generation system of FIG. 5 generates a third frequency clock Fr3 having a second predetermined frequency ratio relative to the first frequency clock Fr1, where the frequency of the first frequency clock Fr1 is 27 MHz, and the that of the third frequency clock Fr3 is 36.864 MHz.

As shown in FIG. 2, the first frequency clock Fr1 is inputted into a second PLL circuit 10b as a reference clock to generate a second oscillation frequency signal of 147.456 MHz. The second oscillation frequency signal is frequency-divided by a frequency divider 16b by a frequency division factor of 4 to generate the third frequency clock Fr3.

The first frequency clock Fr1 inputted into the PLL circuit 10b is frequency-divided by a second reference input frequency division circuit 11b by a frequency division factor of 25. As in the first embodiment described above, the S/N ratio of the second reference input clock P1 is limited to 90 [dB] by the S/N ratio of the noise floor.

A second phase comparator 13b receives and compares the phases of the second reference input clock P1 and the second comparison input clock P2, thereby providing a second phase comparison output.

A second low-pass filter 14b allows the first phase comparison output of the second phase comparator 13b to pass through it to a second controllable oscillator 15b.

Upon reception of the filtered output as a control input from the second low-pass filter 14b, the second controllable oscillator 15b generates a second oscillation frequency signal having a predetermined frequency division ratio relative to the third frequency clock Fr3.

A second comparison input frequency division circuit 12b is a frequency division factor switching type frequency division circuit for obtaining the second comparison input clock P2 through dynamic frequency division of the second oscillation frequency signal received from the second controllable oscillator 15b in accordance with the frequency control signal supplied by a second frequency division factor control circuit 20b, in which the second oscillation frequency signal is frequency divided by different frequency division factors.

The second comparison input frequency division circuit 12b has a frequency division circuit 12b-1 having a fixed frequency division factor and a frequency division circuit 12b-2 connected in series with the second frequency division circuit 12b-1 and having a variable frequency division factor, which can be varied through switching in accordance with the second frequency control signal. The frequency division factor of the frequency division circuit 12b-1 is 4, and the frequency division factors of the frequency division circuit 12b-2 are 34 and 35. Alternatively, the second comparison input frequency division circuit 12b may be replaced by a frequency division circuit having a variable frequency division factor. In this case, the frequency division factors of frequency division circuit may be 136 and 140.

In order that the second 147.456 MHz oscillation frequency signal can be obtained from the first 27 MHz frequency clock Fr1, the switching of the frequency division factors of the frequency division circuit 12b-2 is performed such that the frequency division factor 35 is selected twice when the frequency division factor 34 is selected 13 times. The resultant frequency division ratio is 2048/375, as conventional, as given by the following formula.

$$2048/375=[(4\times34\times13)/25+(4\times35\times2)/25]\times1/15=136.533/25 \quad 27 \text{ MHz} \times 136.533/25=147.456 \text{ MHz}$$

The S/N ratios [dB] of the second reference input clock P1 of the second phase comparator 13b and of the second comparison input clock P2 are then 90 [dB]. Since the input to the second comparison input frequency division circuit 12b is the second comparison input clock P2 multiplied by 136.533, the S/N ratio will be reduced by the multiplication by 20log136.533 [dB]. Hence, the S/N ratio of the input to the second comparison input frequency division circuit 12b, i.e. the S/N ratio [dB] of the second oscillation frequency signal, amounts to 90 [dB] of the second comparison input clock P2 minus 20log136.533 [dB], which equals 47.4 [dB]. This S/N ratio, 47.4 [dB], is much higher as compared with that of related art.

The second frequency division control signal is formed by the second frequency division factor control circuit 20b. The second frequency division factor control circuit 20b has a second FF circuit 21b which receives the output clock (having a ¼ frequency of the second oscillation frequency signal) of the frequency division circuit 12b-1 as a clock input and also receives the output clock of the frequency division circuit 12b-2 (that is, the second comparison input clock P2) as a data input and generates an output signal Q.

A second counter 22b is a repetition type counter that repeats counting, starting from an initial value, 0 for example, to a preset value, 14 for example, upon receipt of the output signal Q from the third FF circuit 21b, and then outputs the count.

A second decoder 23b generates a second decode output obtained by decoding the count of the second counter 22b. The second decode output consists of 13H level outputs 13 and 2 L level outputs in accord with the count 0–14. Preferably, the count is decoded such that the H and L levels are randomly distributed as much as possible in sequence, like, for example, H, H, H, H, H, H, H, L, H, H, H, H, H, H, and L.

A fourth FF circuit 24b receives as a data input the second decode output of the second decoder 23b and as a clock input the output of the third FF circuit 21b, and provides its Q output as the second frequency division factor control signal having H or L level. This second frequency division factor control signal is supplied to the frequency division circuit 12b-2. When the second frequency division factor control signal is high (H), frequency division factor of 34 is selected. When it is low (L), frequency division factor of 35 is selected.

Every time the frequency division factor is selected (or switched), the output of the second phase comparator 13b changes slightly. However, the change has no appreciable influence on the oscillation frequency of the second controllable oscillator 15b, since any slight change in phase of the phase comparison output is absorbed by the second low-pass filter 14b.

A second group of multiple frequency dividers 16b, 17b, 18b, and 19b are provided to respectively frequency-divide the 147.456 MHz second oscillation frequency signal by different frequency division factors 4, 6, 8, and 12. The second group of multiple frequency dividers 16b, 17b, 18b, and 19b provide a third series of clocks Fr3s that includes the third frequency clock Fr3 (with S/N ratio of 59.4 [dB]) and clocks of 24.576 MHz (with S/N ratio of 63.0 [dB]), 18.432 MHz (with S/N ratio of 65.4 [dB]), and 12.288 MHz (with S/N ratio of 69.0 [dB]) each having a predetermined frequency ratio relative to the third frequency clock Fr3.

It should be appreciated that, from the 27 MHz reference frequency clock, the third 36.864 MHz reference frequency clock series can be generated with sufficient S/N ratio using one PLL circuit, in spite of the limitation by the S/N ratio of the noise floor.

Figure 3:
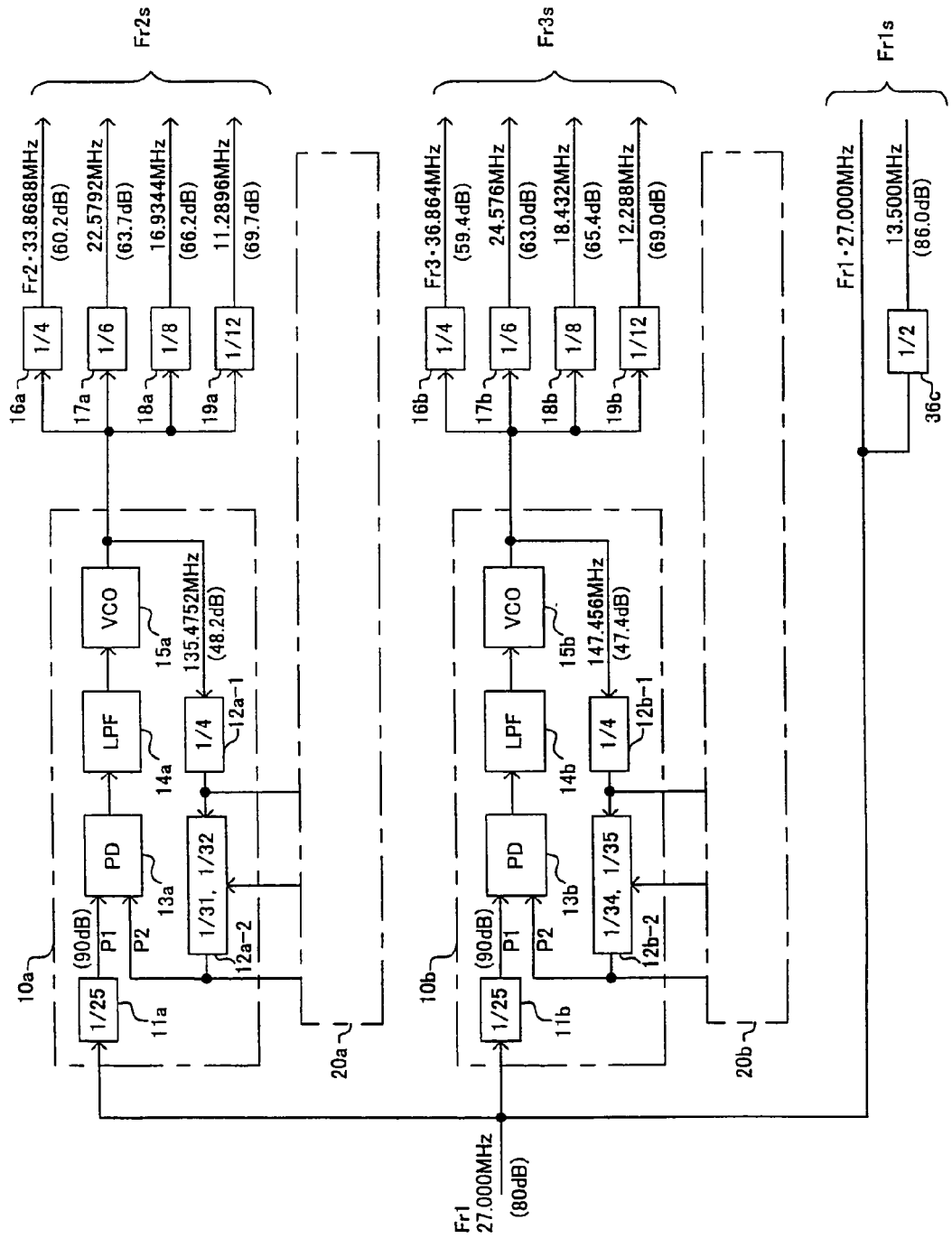
FIG. 3 is a block diagram representation of a clock generation system in accordance with a third embodiment of the invention.

Referring to FIG. 3, there is shown a clock generation system utilizing PLL circuits in accordance with a third embodiment of the invention. The clock generation system shown in FIG. 3 receives as a reference clock the 27 MHz first reference frequency clock Fr1, and generates the 27 MHz first reference frequency clock series Fr1s for video use, a 33.8688 MHz second reference frequency clock series Fr2s for audio use (particularly for CDs), and a 36.864 MHz third reference frequency clock series Fr3s for audio use (particularly for DVDs).

As shown in FIG. 3, the section of the third embodiment for generating the 33.8688 MHz clock series Fr2s is the same as that of the first embodiment shown in FIG. 1, and the section of the third embodiment for generating the 36.864 MHz clock series Fr3s is the same as that of the second embodiment shown in FIG. 2. The third embodiment is further provided with an additional section for generating, from the first reference clock Fr1 inputted as a reference frequency clock, a 27 MHz first reference frequency clock series Fr1s for video use.

The 27 MHz first reference frequency clock series Fr1s includes, in addition to the first reference frequency clock Fr1, a clock of 13.500 MHz (having S/N ratio of 86.0 [dB]) obtained through frequency-division by a frequency divider 36c by a frequency division factor of 2.

The third embodiment shown herein utilizes two PLL circuits that operates on the basis of the 27 MHz reference frequency clock, generating: a 27 MHz first reference frequency clock series Fr1s for video use; a 33.8688 MHz second reference frequency clock series Fr2s for audio use (particularly for CDs); and a 36.864 MHz third reference frequency clock series Fr3s for audio use (particularly for DVDs) with sufficient S/N ratios in spite of the limitation by the S/N ratio of the noise floor involved.

FIG. 4 summarizes the clocks provided by the invention and related art, along with the S/N ratios associated with the respective clocks. As seen in FIG. 4, the invention provides frequency clocks having exceedingly high S/N ratios as compared with related art systems.

I claim:

1. A clock generation system for generating at least a first frequency clack, a second frequency clock having a predetermined first frequency ratio relative to said first frequency clock, and a third frequency clock having a predetermined second frequency ratio relative to said first frequency clock, said clock generation system comprising:

a first PLL circuit that includes a frequency division factor switching type frequency division circuit having a first phase comparator for comparing the phases of a first reference input clock and a first comparison input clock to generate a first phase comparison output in accord with the comparison, a first low-pass filter for passing said first phase comparison output, a first controllable oscillator receiving the filtered output from said first low-pass filter as a control input far controlling said first controllable oscillator adapted to generate a first oscillation frequency signal having a predetermined frequency ratio relative to said second frequency clock, a first reference input frequency division circuit for frequency-dividing said first frequency clock that is inputted as a reference clock to thereby obtain said first reference input clock, and a first comparison input frequency division circuit for frequency-dividing the first oscillation frequency signal of said first controllable oscillator to obtain said first comparison input clock, wherein one of said first comparison input frequency division circuit and first reference input frequency division circuit is adapted to frequency-divide said first oscillation frequency signal or said first frequency clock, respectively, by a different frequency division factor according to a first frequency division factor control signal;

a first frequency division factor control circuit receiving a clack based on said first oscillation frequency signal and one of said first comparison input clock and first reference input clock, generating said first frequency division factor control signal such that said first oscillation frequency signal has a fixed frequency ratio relative to said second frequency clock, and switching the frequency division factor of said first comparison input frequency division circuit or of said first reference input frequency division circuit;

a second PLL circuit that includes a frequency division factor switching type frequency division circuit having a second phase comparator for comparing the phases of a second reference input clock and a second comparison input clock to generate a second phase comparison output in accord with the comparison, a second low-pass filter for passing said second phase comparison output, a second controllable oscillator receiving the filtered output from said second low-pass filter as a control input for controlling said second controllable oscillator adapted to generate a second oscillation frequency signal having a predetermined frequency ratio relative to said third frequency clock, a second reference input frequency division circuit for frequency-dividing said first frequency clock that is inputted as a reference clock to thereby obtain said second reference input clock, and a second comparison input frequency division circuit for frequency-dividing the second oscillation frequency signal of said second controllable oscillator to obtain said second comparison input clock, wherein one of said second comparison input frequency division circuit and second reference input frequency division circuit is adapted to frequency-divide said second oscillation frequency signal or said first frequency clock, respectively, by a different frequency division factor according to a second frequency division factor control signal; and a second frequency division factor control circuit receiving a clock based on said second oscillation frequency signal and one of said second comparison input clock and said second reference input clock, generating said second frequency division factor control signal such that said second oscillation frequency signal has a fixed frequency ratio relative to said third frequency clock, and switching the frequency division factor of said second comparison input frequency division circuit or of said second reference input frequency division circuit, wherein:

said first frequency division factor control circuit has a first flip-flop circuit receiving as a clock input a clock based on said first oscillation frequency signal and receiving as a data input one of said first comparison input clock and first reference input clock, a first counter for repetitively counting the output of said first flip-flop circuit from the initial to a preset value, a first decoder for generating a first decode output obtained by decoding the count of said first counter, and a second flip-flop circuit receiving as a data input said first decode output and receiving as a clock input the output of said first flip-flop circuit to output said first frequency division factor control signal; and said second frequency division factor control circuit has a third flip-flop circuit receiving as a clock input a clock based on said second oscillation frequency signal and receiving as a data input one of said second comparison input clack and second reference input clock, a second counter for repetitively counting the output of said third flip-flop circuit from the initial thereof to a preset value, a second decoder for generating a second decode output obtained by decoding the count of said second counter, and a forth flip-flop circuit receiving as a data input said second decode output and receiving as a clock input the outwit of said third flip-flop circuit to output said second frequency division factor control signal.

2. The clock generation system according to claim 1, wherein said second frequency clock is obtained by frequency-dividing said first oscillation frequency signal by a predetermined frequency division factor, while said third frequency clock is obtained by frequency-dividing said second oscillation frequency signal by a predetermined frequency division factor.

3. The clock generation system according to claim 2, wherein the frequencies of said first, second, and third frequency clocks are 27 MHz, 33.8688 MHz, and 36.864 MHz, respectively.

4. The clock generation system according to claim 1, further comprising:

a first group of multiple frequency dividers for frequency-dividing said first oscillation frequency signal by different frequency division factors to generate a second frequency clock series that includes said second frequency clock and a multiplicity of clocks each having a predetermined frequency ratio relative to said second frequency clack;

a second group of multiple frequency dividers for frequency-dividing said second oscillation frequency signal by different frequency division factors to generate a third frequency clock series that includes said third frequency clock and a multiplicity of clocks each having a predetermined frequency ratio relative to said third frequency clock; and at least one frequency divider for frequency-dividing said first frequency clock by a predetermined frequency division factor to generate a first frequency clock series that includes said first frequency clock and at least one clock having a predetermined frequency ratio relative to said first frequency clock.

5. The clock generation system according to claim 4, wherein the frequencies of said first, second, and third frequency clocks are 27 MHz, 33.8688 MHz, and 36.864 MHz, respectively.

6. The clock generation system according to claim 1, wherein the frequencies of said first, second, and third frequency clocks are 27 MHz, 33.8688 MHz, and 36.864 MHz, respectively.

7. A clock generation system for generating a second frequency clock based on a first frequency clock, said second frequency clock having a predetermined frequency ratio relative to said first frequency clock, said clock generation system comprising:

a PLL, circuit that includes a frequency division factor switching type frequency division circuit having a phase comparator for comparing the phases of a reference input clock and a comparison input clock to generate a phase comparison output in accord with the comparison, a low-pass filter for passing said phase comparison output, a controllable oscillator receiving the filtered output from said low-pass filter as a control input for controlling said controllable oscillator adapted to generate an oscillation frequency signal having a predetermined frequency ratio relative to said second frequency clock, a reference input frequency division circuit for frequency-dividing said first frequency clock that is inputted as a reference clock to thereby obtain said reference input clock, and a comparison input frequency division circuit for frequency-dividing the oscillation frequency signal of said first controllable oscillator to obtain said comparison input clock, wherein one of said comparison input frequency division circuit and reference input frequency division circuit is adapted to frequency-divide said oscillation frequency signal or said first frequency clock, respectively, by a different frequency division factor according to a frequency division factor control signal; and a frequency division factor control circuit receiving a clock based on said oscillation frequency signal and one of said comparison input clock and reference input clock, generating said frequency division factor control signal such that said oscillation frequency signal has a fixed frequency ratio relative to said second frequency clock, and switching the frequency division factor of said comparison input frequency division circuit or of said reference input frequency division circuit, wherein said frequency division factor control circuit has:

a first flip-flop circuit receiving as a clock input a clock based on said oscillation frequency signal and receiving as a data input one of said comparison input clock and reference input clock;

a counter for repetitively counting the output of said first flop-flop circuit from the initial to a preset value;

a decoder for generating a decode output obtained by decoding the count of said counter; and a second flip-flop circuit receiving as a data input said first decode output and receiving as a clock input the output of said first flip-flop circuit to output said frequency division factor control signal.

8. The clock generation system according to claim 7, wherein the frequencies of said first and second frequency clocks are 27 MHz and 33.8688 MHz, respectively.

9. The clock generation system according to claim 7, wherein the frequencies of said first and second frequency clocks are 27 MHz and 36.864 MHz, respectively.

* * * * *